United States Patent [19]
Ju

[11] Patent Number: 6,074,231
[45] Date of Patent: Jun. 13, 2000

[54] CONNECTOR STRUCTURE HOLDING CENTRAL PROCESSING UNITS OF BOTH CARTRIDGE TYPE AND CARD TYPE

[76] Inventor: Ted Ju, No. 15, Wu Shiunn St., An Leh District, Keelung City, Taiwan

[21] Appl. No.: 09/188,260

[22] Filed: Nov. 10, 1998

[51] Int. Cl.⁷ .................................................. H01R 13/62
[52] U.S. Cl. .......................... 439/327; 439/64; 439/329; 439/328; 439/377; 361/801
[58] Field of Search .............................. 439/64, 377, 327, 439/328, 329, 325; 361/801

[56] References Cited

U.S. PATENT DOCUMENTS

| | | | |
|---|---|---|---|
| 3,829,741 | 8/1974 | Athey ....................................... | 317/101 |
| 3,853,379 | 12/1974 | Goodman et al. ......................... | 339/75 |
| 5,889,656 | 3/1999 | Yin ........................................... | 361/801 |
| 5,928,024 | 7/1999 | Ming-huang ............................. | 439/377 |
| 5,943,218 | 8/1999 | Liu .......................................... | 361/801 |

*Primary Examiner*—Paula Bradley
*Assistant Examiner*—Truc Nguyen
*Attorney, Agent, or Firm*—Bacon & Thomas

[57] ABSTRACT

Disclosed in the invention is a connector structure that is used on a mother board for holding a central processing unit of cartridge type or card type. The connector structure comprises two connector halves. Each connector half has retaining slots and elongated notches formed on the upper portion thereof. Such an arrangement makes the connector structure adapted for holding cartridge type central processing units. The connector half has an incompletely connected retaining protrusion on one side. The retaining protrusion extends obliquely and inwardly and has locking means disposed on the lower end and an upwardly extending moving lever arranged on the outside of the locking means. The above arrangement makes the connector suitable for holding a card type central processing unit. Each connector half is composed of a stationary piece pivotally connected with a movable piece. Thus the connector can be folded when not in use to decrease the space it takes. Alternatively the connector half also can be integrally molded.

11 Claims, 13 Drawing Sheets

6,074,231

CONNECTOR STRUCTURE HOLDING CENTRAL PROCESSING UNITS OF BOTH CARTRIDGE TYPE AND CARD TYPE

BACKGROUND OF THE INVENTION (a) Field of the Invention

An electronic connector used on a mother board to hold central processing units (CPU) comprises two connector halves. More specifically, the connector according to the invention can accommodate central processing units of both cartridge type and card type.

(b) Description of the Prior Art

Currently CPUs in the market such as Intel or Celeron, are generally divided into two categories, cartridge type and card type. They are significantly different in structure. Consequently manufacturers of downstream computer peripheral devices must develop new type connectors (shown in FIG. 13) to accommodate a cartridge type CPU. A conventional CPU connector 81 has a generally U-shaped structure. It mainly comprises two vertical portions 82 at two ends thereof. Two vertical portions 82 respectively have a retaining slots 820 disposed on the wall surface facing each other. Each vertical portion 82 comprises two side portions 821 disposed on two sides thereof. Two opposite side portions 821 have notches 822 arranged near the top thereof. Retaining slots 820 and notches 822 are located in positions corresponding to specific means of Pentinum II CPU 80 so that they can secure a cartridge type CPU. For instance, the Pentinum 11 CPU 80 has two locking levers 801 separately near the top on two sides thereof. Arranged under the locking lever 801 is a latch 802 that protrudes from the CPU body and that will engage with a retaining slot 820 when the CPU is seated in a connector. Moving the lock lever 801 will retract the latch 802. The Pentinum II CPU 80 further has a protrusion 803 formed on two sides of two end portions, which will be caught by the notches 822 of the connector 81.

Another conventional connector used for a card type CPU 90 with a heat sink 91 is shown in FIG. 14. It primarily comprises a connector body 92 capable of receiving a card type CPU with holding means 93 provided on two ends thereof. The holding means 93 have a configuration in which ribs 930 on the opposite inner wall surfaces constitute two U-shaped slots 931. Two adjacent U-shaped slots 931 define a space 932 therebetween.

After a card type CPU 90 is inserted into a holding device 94 and attached to a heat sink 91, the combination can be coupled with an aforesaid connector with the heat sink 91 and the card type CPU 90 respectively extending into the U-shaped slots 931 and the space 932. From the above description evidently manufacturers of computer peripheral devices must develop different connector structures for holding these two types of CPU on a mother board. Thus it is not cost-effective in manufacturing and assembling.

SUMMARY OF THE INVENTION

The primary object of the invention is to provide a connector structure that is adapted for holding CPU of both cartridge and card types. The connector according to the invention consists of two connector halves having the same structure. Each connector half has retaining slots and notches arranged on the upper portion, which can secure a CPU in cooperation with the locking means of the CPU. The connector half further has an incompletely connected resilient retaining protrusion, which inwardly inclinedly extends and has locking means disposed on the lower portion, and a moving lever that is formed on the outer side of the retaining protrusion and extends upwardly. With the retaining protrusion and the moving lever, the connector according to the invention is also adapted for receiving and holding a card type CPU. Therefore, the connector according to the invention can be used for CPU of both types. As a result the connector makers of the industry need not produce two types of connectors. It is advantageous in saving costs of molding tooling.

Another object of the invention is to provide a connector structure that either can be a one-piece part or can be compose of a movable piece and a stationary piece pivotally connected so that the connector can be folded when not in use to reduce its volume and to facilitate transportation.

Another object of the invention is to provide a connector structure of which the connector halves have two base portions on two sides of the lower end. Each base portion is provided with a stud on the underside. A fastening nail is inserted into a central opening of the stud to keep the connector half firmly attached to a mother board. The arrangement can provide a benefit of simple assembling without using aid tools.

DETAILED DESCRIPTION OF THE PREFERRED EMBODIMENTS

FIGS. 1 through 10 show the first embodiment of a CPU connector according to the invention. The CPU connector according to the invention comprises two connector halves that can be mounted on a mother board and hold a CPU either of a cartridge type or of a card type. Two connector halves have the same structure and thus only one will be described here in detail.

Figure 1:
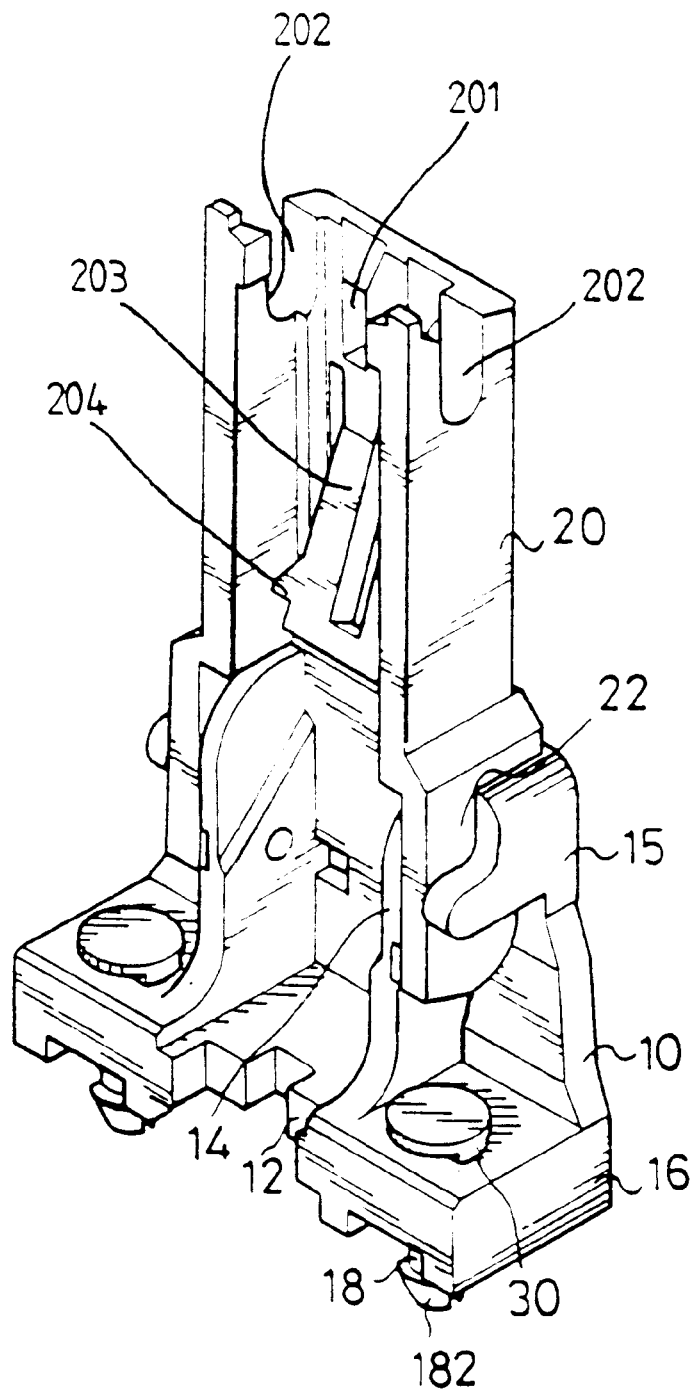
FIG. 1 is a perspective view of a connector half of the first embodiment of a central process unit (CPU) connector according to the invention in an assembled state.
Figure 2:
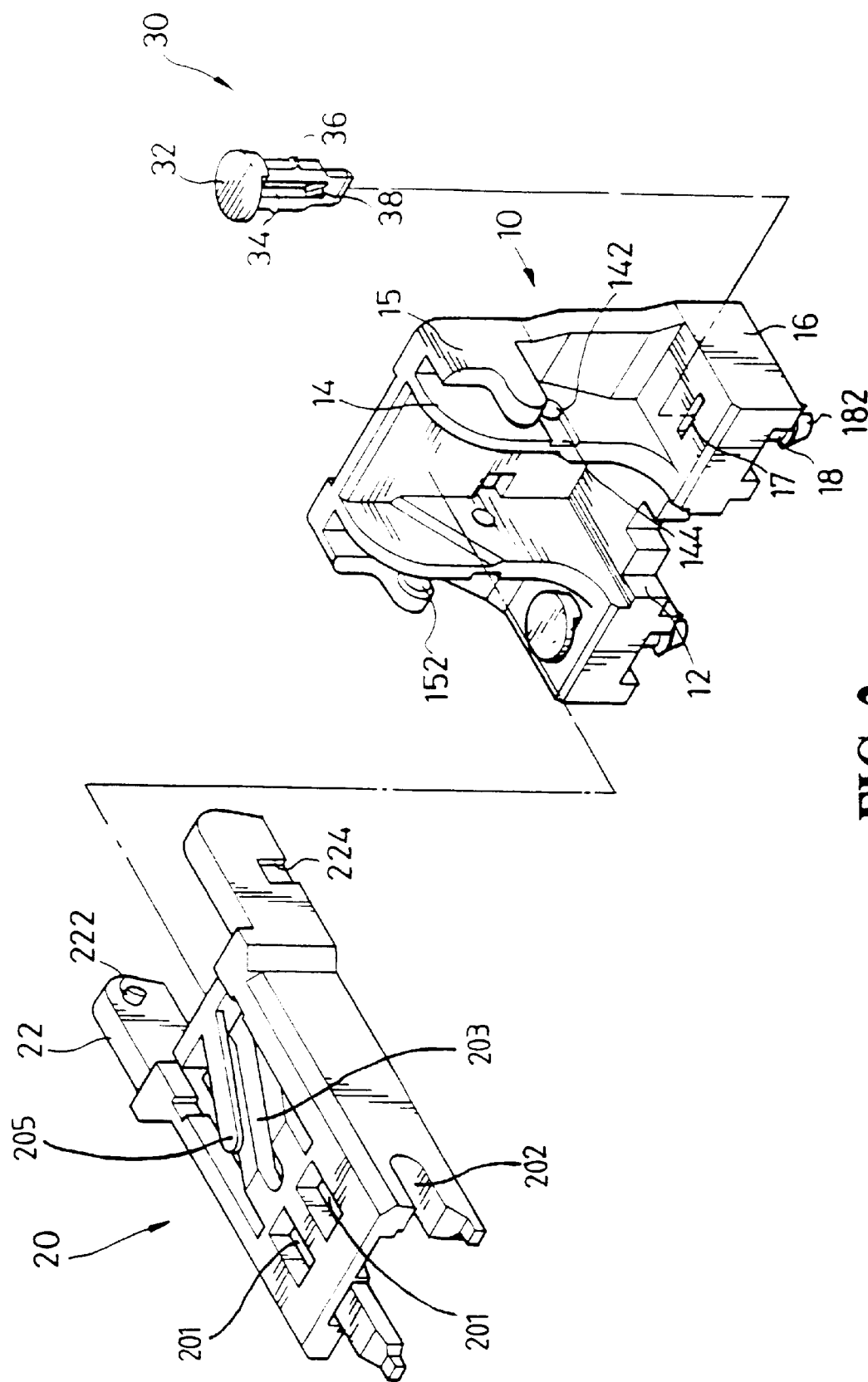
FIG. 2 is an exploded view of the connector half of FIG. 1.

As shown in FIGS. 1 and 2, the connector half consists of a movable piece 20 pivotally connected with a stationary piece 10.

Figure 3:
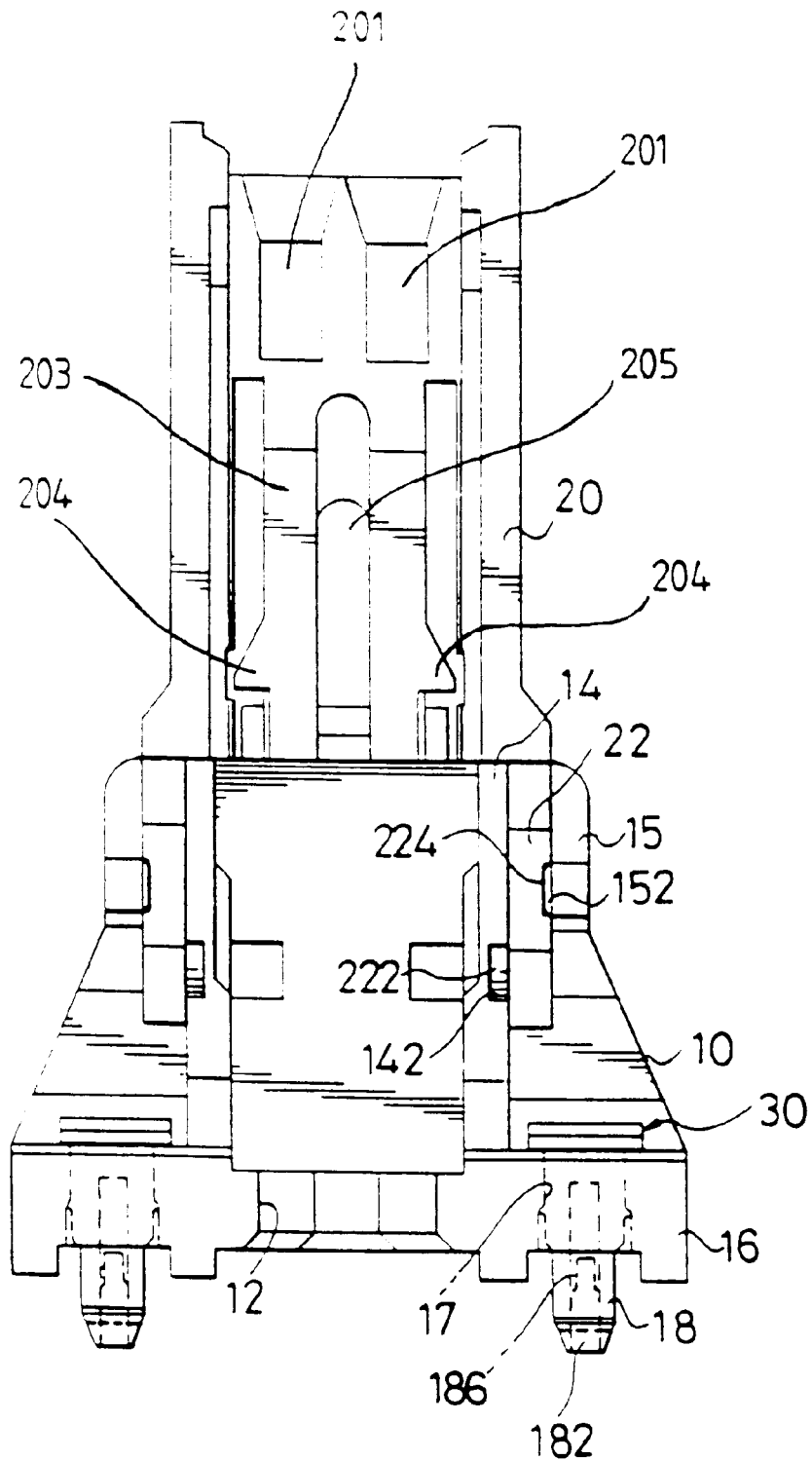
FIG. 3 is a front view showing the connector half in an assembled state.
Figure 4:
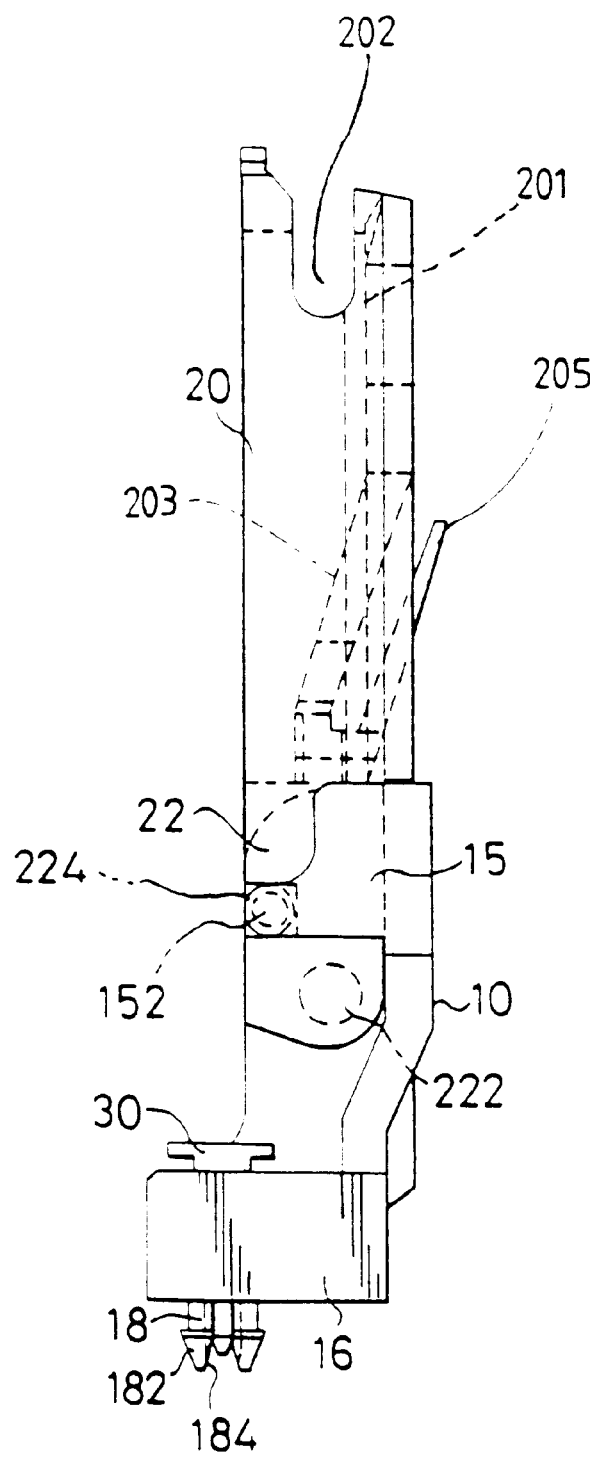
FIG. 4 is a side view of the connector half in an assembled state.
Figure 6:
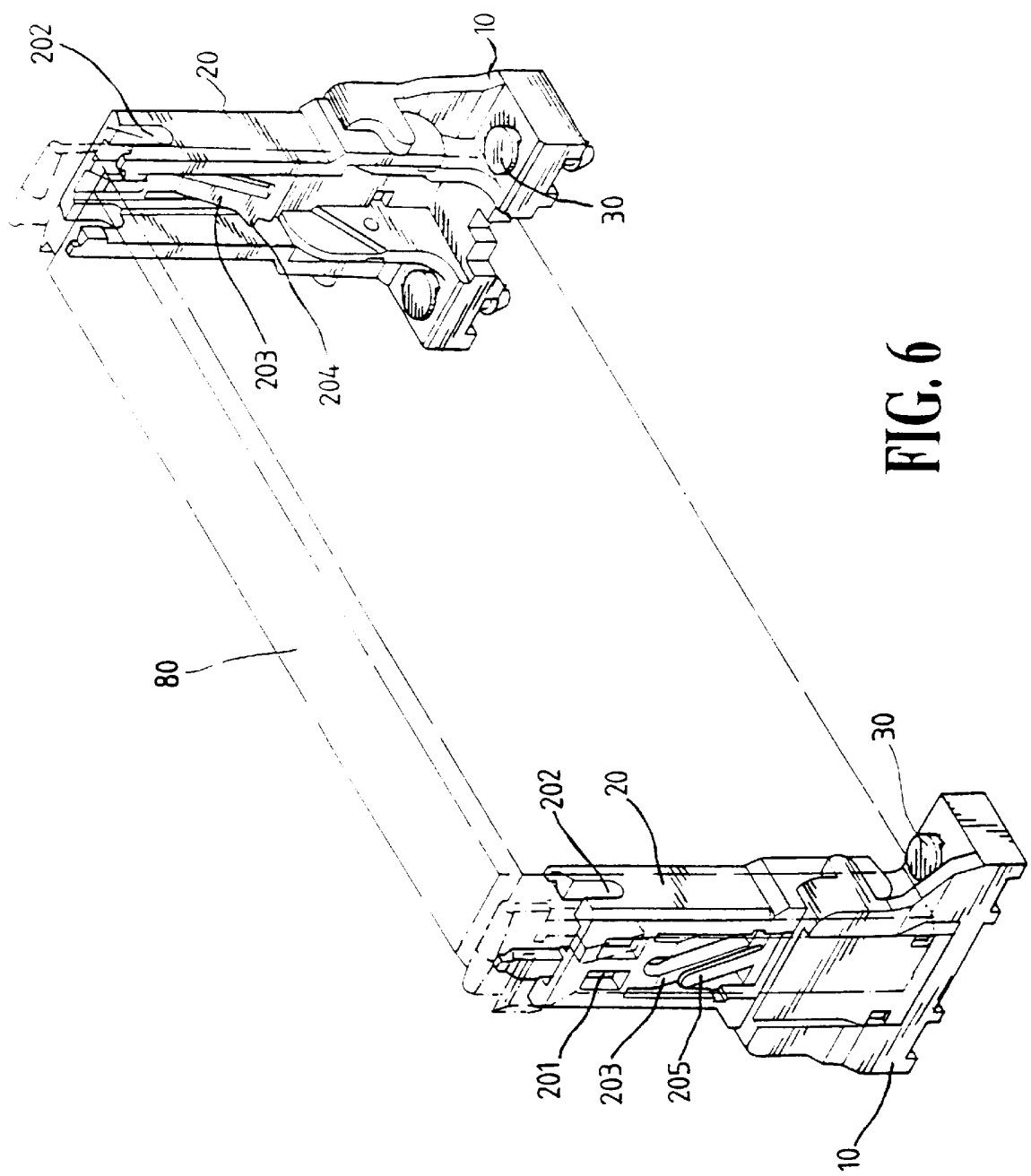
FIG. 6 schematically illustrates how two halves of the inventive connector hold a cartridge type CPU.

The stationary piece 10 has a body having a generally L-shaped cross section. The stationary piece 10, as shown in FIGS. 3 and 4, is provided on its bottom at the central position thereof with a receiving slot 12 by which two connector halves cooperate with each other to hold a CPU on its two ends. In this way two connector halves constitute a CPU connector as shown in FIG. 6. The stationary piece 10 is further equipped at its internal bottom surface near the two ends of the receiving slot 12 with a flange wall 14 vertically extending upwardly to the top thereof. Two flange walls 14 respectively have a recessed pivotal slot 142 formed on the opposite outer side surfaces thereof.

Figure 5:
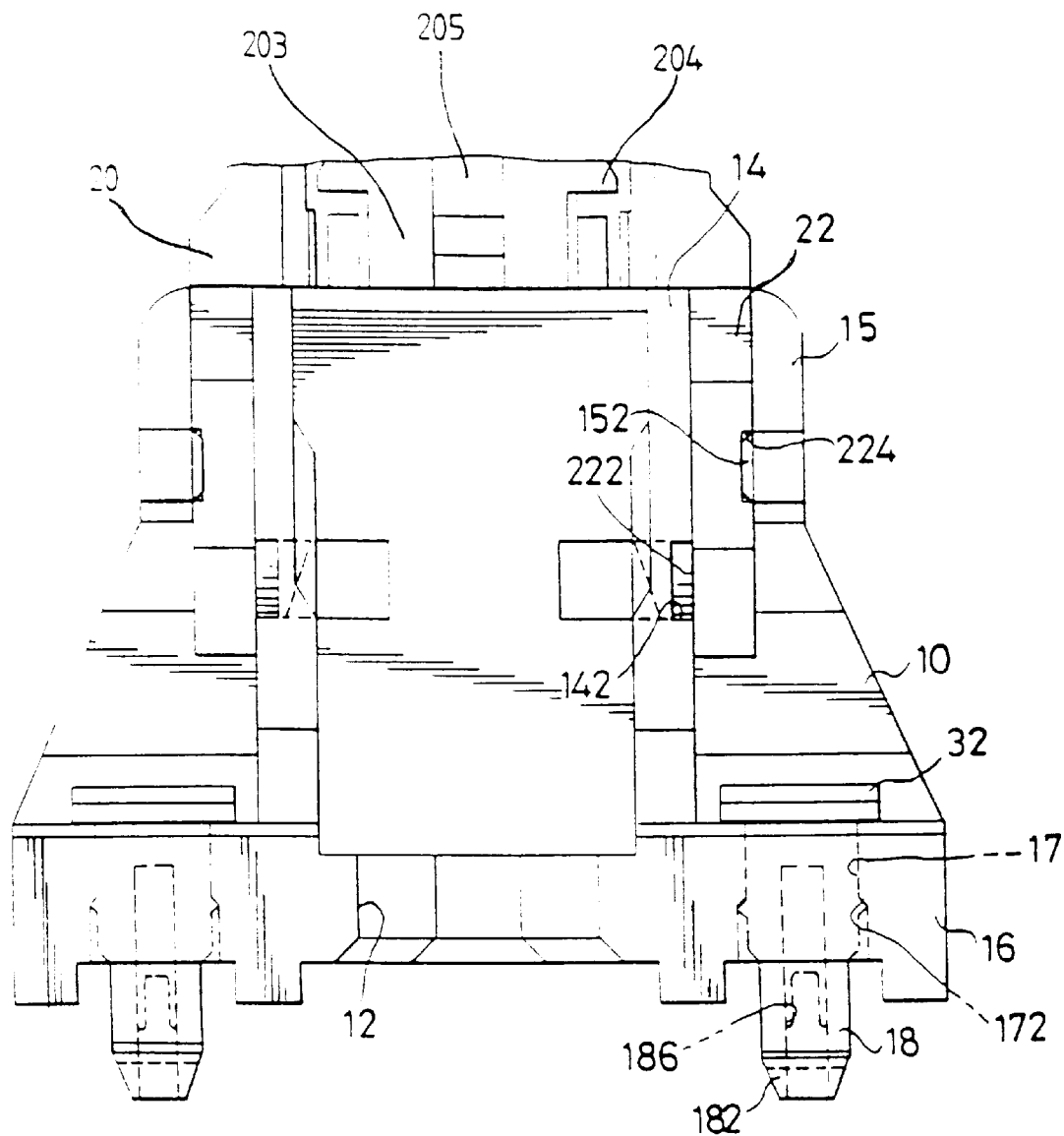
FIG. 5 is a partial front view of the connector half of FIG. 1.

The movable piece 20 has a generally rectangular body as shown in FIGS. 2, 3, and 5. The upper portion of the movable piece 20 is provided with two retaining slots 201 and two elongated notches 202 for receiving and holding a cartridge type CPU (shown in FIG. 6). The movable piece 20 is further provided with an incompletely connected retaining protrusion 203. The retaining protrusion 203 inwardly obliquely extends and is configured to have locking means 204 on the lower portion and a moving lever 205 extending from the lower end thereof upwardly over the locking means. The retaining protrusion 203 enables the connector to secure a card type CPU 90. Furthermore, one end of the movable piece 20 extends to form two parallel pivotal arms 22 each with a pivotal pin 222 formed thereon. The distance between two parallel pivotal arms 22 approximately equals to that between the opposite outer or inner wall surfaces of two flange walls 14 of the stationary piece 10 so that when the movable piece 20 is assembled with the stationary piece 10, two pivotal arms 22 abut against the opposite outer or inner wall surfaces of two flange walls 14. Two pivotal pins 222 are each formed on the opposed inner wall surfaces of two pivotal arms 22. The pivotal slots 142 individually are disposed on the opposite outer wall surfaces of the flange walls 14 at such a position that the pivotal pins 222 of the pivotal arms 22 extend into the pivotal slots 142. By such an arrangement the movable piece 20 can pivotally connected to the stationary piece 10.

The stationary piece 10 is also furnished with two holding arms 15 parallel to the flange walls 14. The distance between the holding arm 15 and its adjacent flange wall 14 is just equivalent to the thickness of the pivotal arms 22 of the movable piece 20 and so when the movable piece 20 is pivotally connected to the stationary piece 10 the flange walls 14 cooperate with the holding arms 15 to constrain the pivotal arms 22. The wall surface of each holding arm 15 facing toward the flange wall 14 is provided with a raised dot 152. Formed on the wall surface of each pivotal arm 22 opposite to the wall surface on which a pivotal pin 222 is formed is an engagement slot 224, which is positioned to engage with a corresponding raised dot 152 on the holding arm 15 of the stationary piece 10.

Hence, after the movable piece 20 is pivotally coupled with the stationary piece 10 and when the movable piece 20 turns to the upright position, the engagement slots 224 will catch raised dots 152 to keep the movable piece 20 in that position as shown in FIG. 6. Accordingly such a connector mounted on a mother board will be able to receive a central processing unit either of cartridge type or of card type and to firmly hold it on two ends by the receiving slots 12, with the help of retaining slots 201, elongated notches 202, and retaining protrusions 203.

Figure 7:
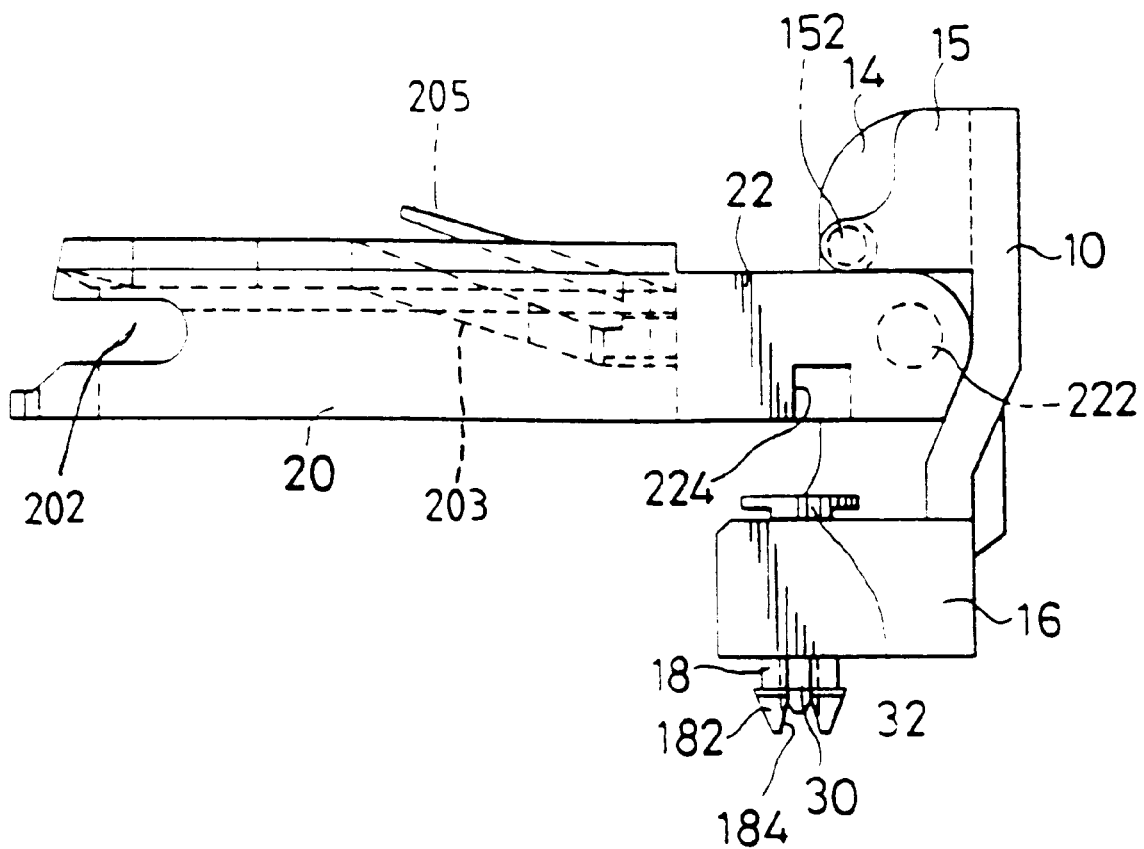
FIG. 7 is a side view showing the connector according to the invention, of which the movable piece turns over ninety degrees to a horizontal position.

Before two connector halves are mounted on a mother board or they have not yet been coupled with a CPU it is possible to reduce required storage space by disengaging the engagement slot 224 of the pivotal arms 22 of the movable piece 20 from the raised dots 152 of the holding arms 15 and turning the movable piece 20 to a horizontal position as shown in FIG. 7. The invention has the advantage of saving packing volume and storage space.

Besides, the pivotal arms 22 of the movable piece 20 are pivotally placed between the flange walls 14 and the holding arms 22. To promote convenience in assembling the movable piece 20 with the stationary piece 10, a guiding slot 144 extending from the wall edge to the pivotal slots 142 is formed on the wall surfaces on which the pivotal slots 142 are disposed. The guiding slot 144 has an inclined bottom surface. The pivotal pins 222 of the pivotal arms 22 have a conical free end. With the conical free end of the pivotal pin 222 guided by the inclined surface of the guiding slot 144, the pivotal arms 22 of the movable piece 20 can be smoothly seated in the space defined by the flange walls 14 and the holding arms 15 with the pivotal pins 222 constrained by the pivotal slots 142 of the flange walls 14. In this way, the movable piece 20 is assembled with a stationary piece 10.

The stationary piece 10 has two base portions 16 each formed on two sides of the receiving slot 12. Each base portion 16 is equipped with a vertical stud 18 on its bottom face. The stud 18 is configured to have a swelled conical free end 182 that is split into two halves by an open slot 184 formed along the longitudinal axis of the stud. Therefore the stud has a resilient property that enables the free end to be squeezed to pass through holes on a mother board until the swelled conical end of the stud 18 abuts against the underside of the mother board. With this arrangement, the stationary piece 10 can be quickly and firmly attached in an easy way to a mother board without the aid of tools.

The stationary piece 10 is also provided on each base portion 16 with a locking opening 17 that is in communication with the open slot 184 of the stud 18. The opening 17 is rectangular in shape and has a stepped internal wall surface. It has a larger opening on the lower portion and a smaller one on the upper portion and a raised flat surface 172 at the intermediate portion. A fastening nail 30 passes through the opening 17 of the base portion 16. The body of fastening nails 30 has a rectangular shape corresponding to the openings 17. Formed on the top of the nail 30 is a swelled head 32 that will stay out of the opening 17 after the nail is driven into a hole. The fastening nail 30 has a resilient hole 34 disposed on the body thereof, which enables the body of the fastening nail to have a flexibility to adapt to external compression. The fastening nail has a raised dot 36 on two sides of the body, which makes the width of the body at the raised dot slightly larger than the dimension of the opening 17, and a projection tongue 38 upwardly extending from the lower edge of the resilient hole 34 to a point where the free end of the projection tongue 38 slightly exceeds the surface of the nail body.

With this arrangement, when the nail 30 is inserted into the opening 17 on the base portion 16 of the stationary piece 10, the lower portion of the nail 30 gradually passes through the opening and gets into the open slot 184 of the stud 18. During that time the body of the nail 30 becomes smaller since it bears pressures resulted from the compression of the raised dots 36 by the internal wall of the opening 17. After the body of the nail 30 under the head portion 32 completely enters the opening 17, the nail 30 can provide a restriction effect to prevent the stud 18 from escaping from the holes on a mother board by disabling the reduction in distance between two halves of the stud 18 when squeezed. Thus the stationary piece can be firmly attached to a mother board.

Figure 9:
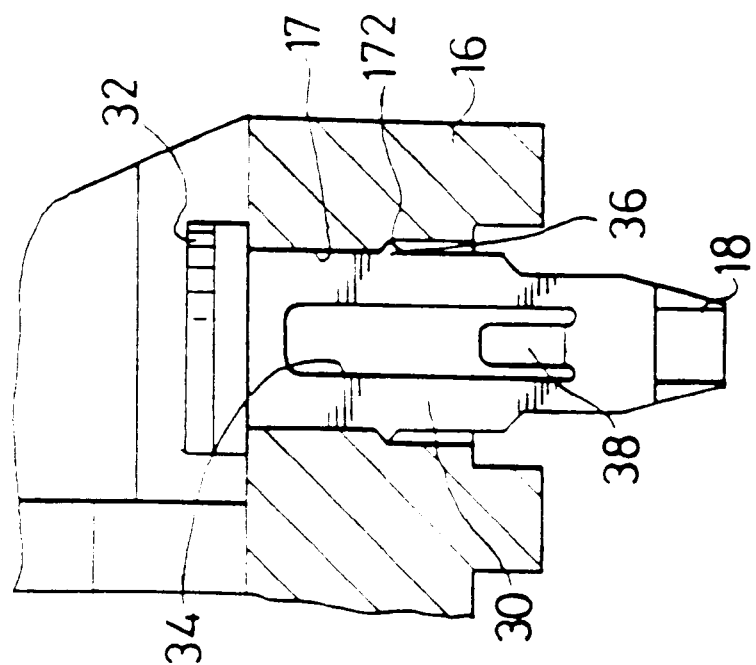
FIG. 9 is a partial cross sectional front view showing the CPU connector of FIG. 1 in a state that the fastening nail has been completely driven into the connector half.
Figure 8:
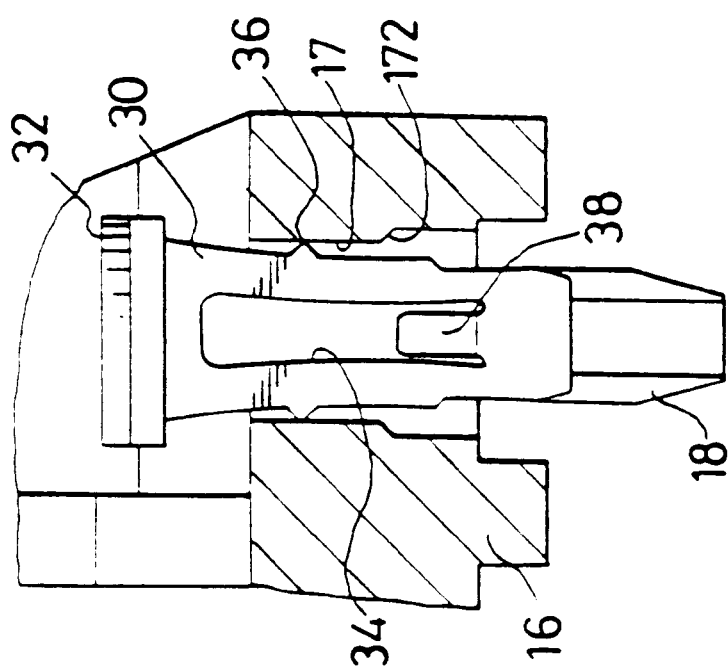
FIG. 8 is a partial cross sectional view showing the CPU connector of FIG. 1 in a state that a fastening nail is incompletely driven into the connector half.
Figure 10:
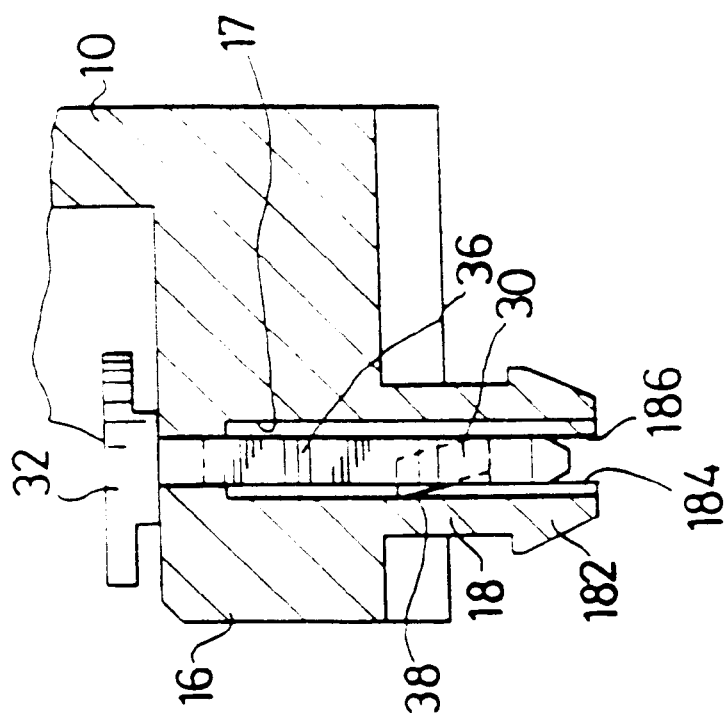
FIG. 10 is another partial cross sectional side view showing the CPU connector of FIG. 1 also in a state that a fastening nail has been entirely driven into the connector half.

When the nail 30 is entirely inserted into the opening 17, two raised dots 36 on two sides of the nail body will press against the internal stepped flat wall surface 172 of the opening 17 as shown in FIG. 9. This arrangement can prevent the nail 30 from getting out of the opening 17 when it bears an external compression force, which will lead to loss of the restriction effect. Further, due to the presence of the upwardly extending projection tongue 38 on the nail 30 as shown in FIG. 10, when the nail 30 is inserted into the opening 17 the free end of the projection tongue 38 will press against the inner wall surface of a stud half to outwardly bias it slightly. As a result the biased wall enhances the strength of combination of the stud 18 with a mother board. In the meantime, the projection tongue 38 can be used as another measure to keep the nail 30 from escaping from the opening 17 and reinforces the stability of the nail 30 in the opening 17. Furthermore, two halves of the stud 18 have a recessed portion 186 formed on the inner wall surfaces thereof that allows the projection tongue 38 to lean against it.

The retaining slots 201 and the elongated notches as described above are solely for holding a cartridge type central processing unit 80. The retaining protrusion 203, due to its mild elastic property, can be used in cooperation with the locking means 204 disposed on the lower portion to secure a heat sink of a card type central processing unit. To take out a central processing unit from the inventive connector, users can pull the moving lever 205 outwardly to release it. Hence, the connector according to the invention can be used to hold a central processing unit either of cartridge type or of card type. It has multiple purposes.

Figure 11:
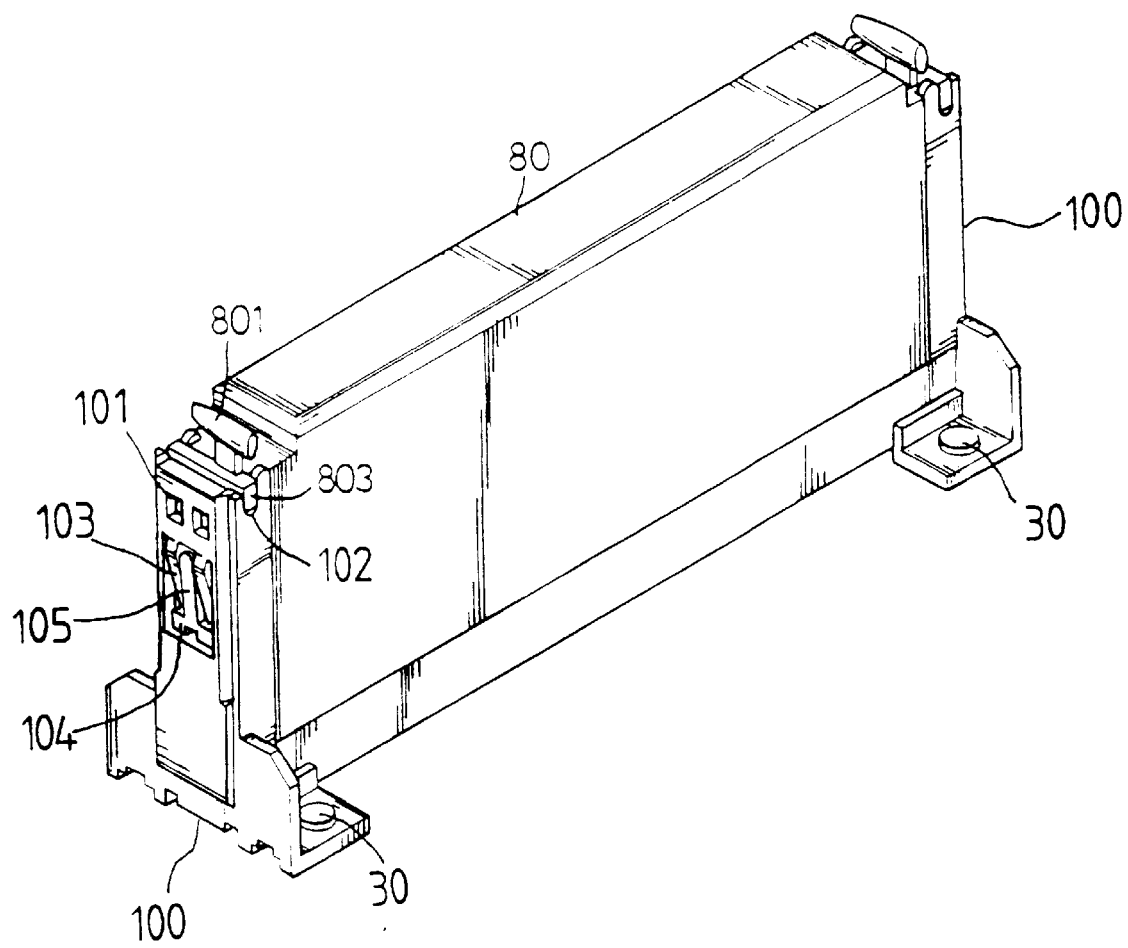
FIG. 11 perspectively shows the second embodiment of a CPU connector according to the invention, of which two connector halves hold a cartridge type CPU.
Figure 12:
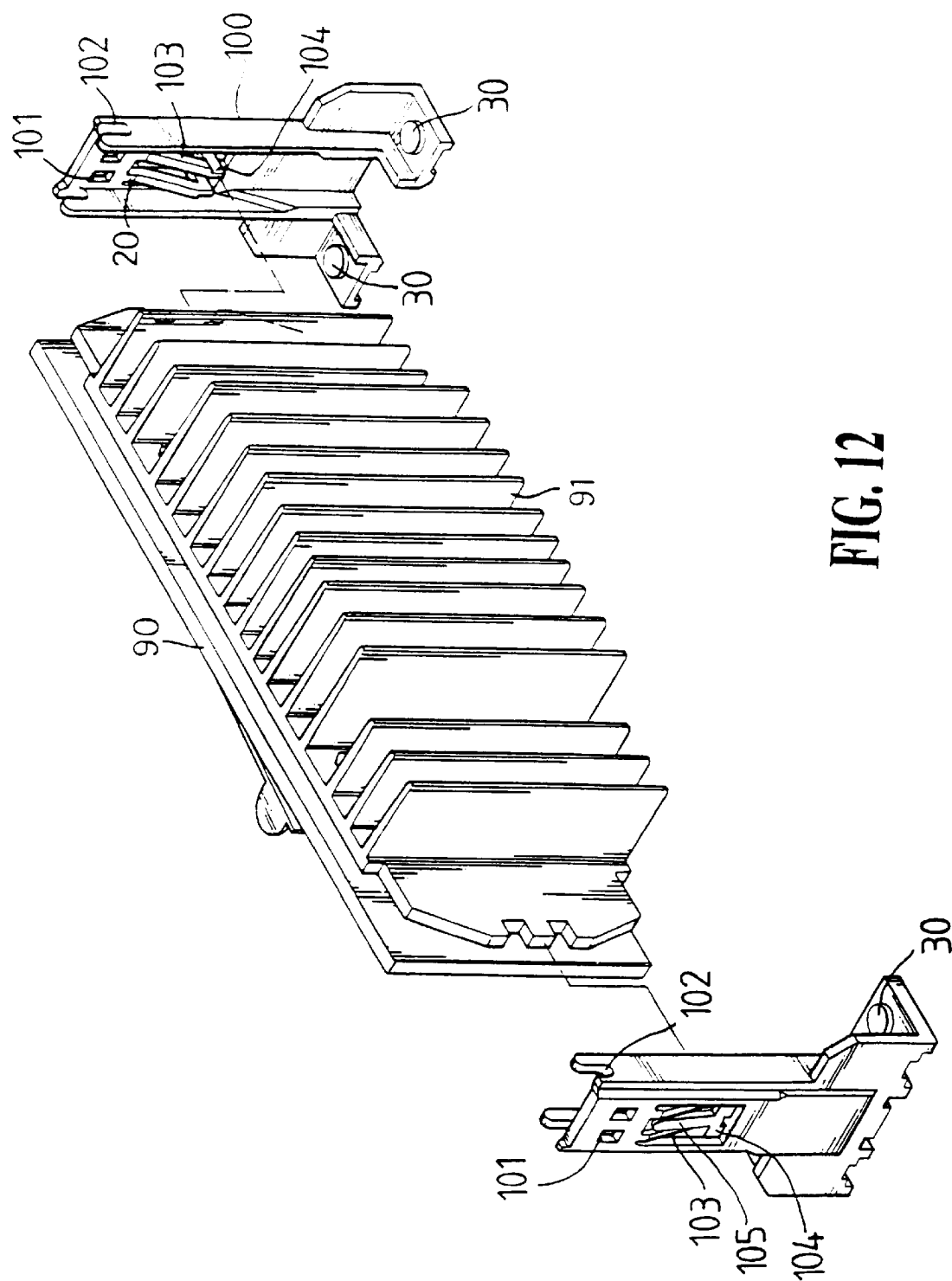
FIG. 12 is an exploded view depicting the CPU connector of FIG. 11, of which two connector halves hold a card type CPU.
Figure 13:
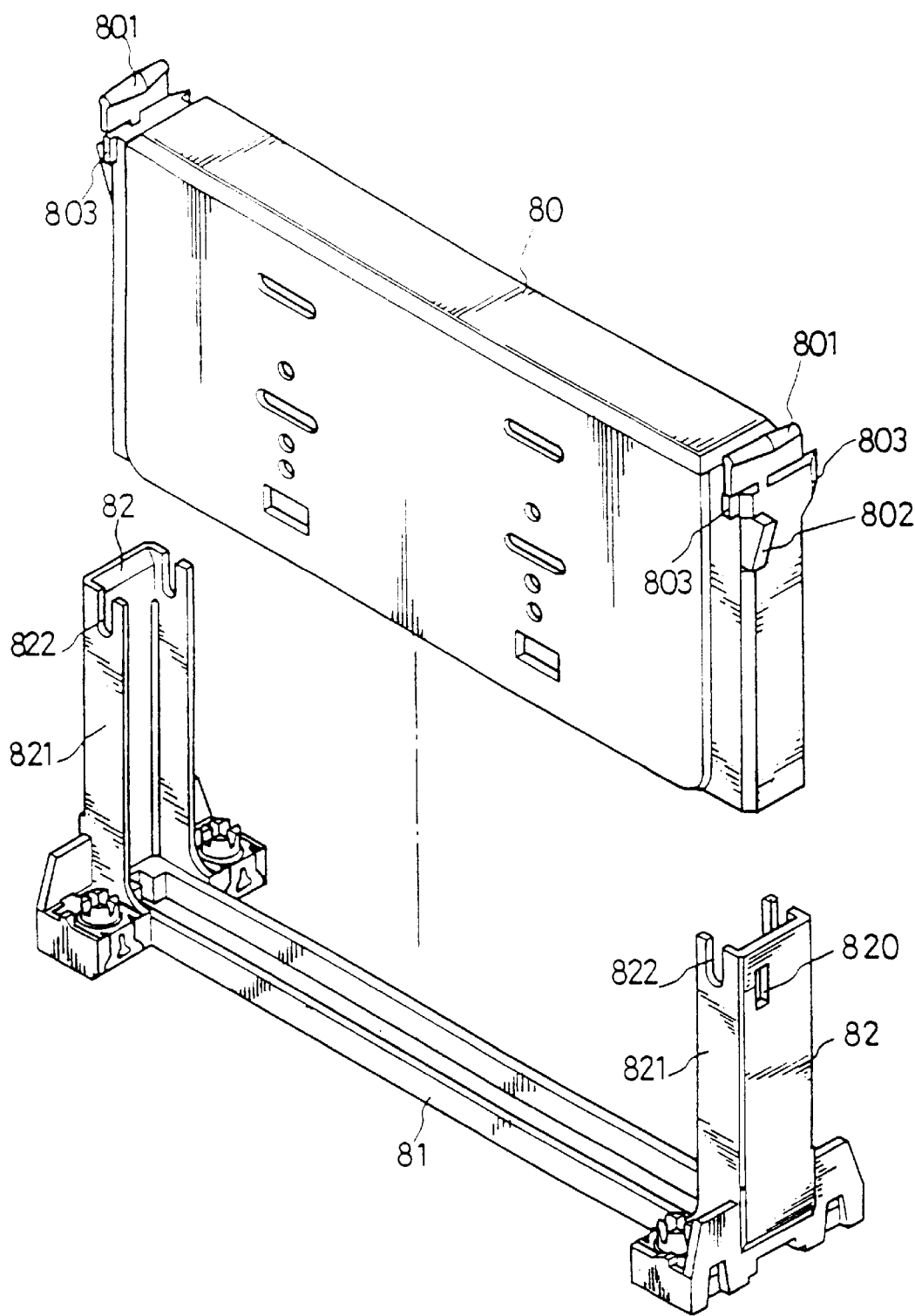
FIG. 13 is an exploded view indicating a conventional connector holding a cartridge type CPU.
Figure 14:
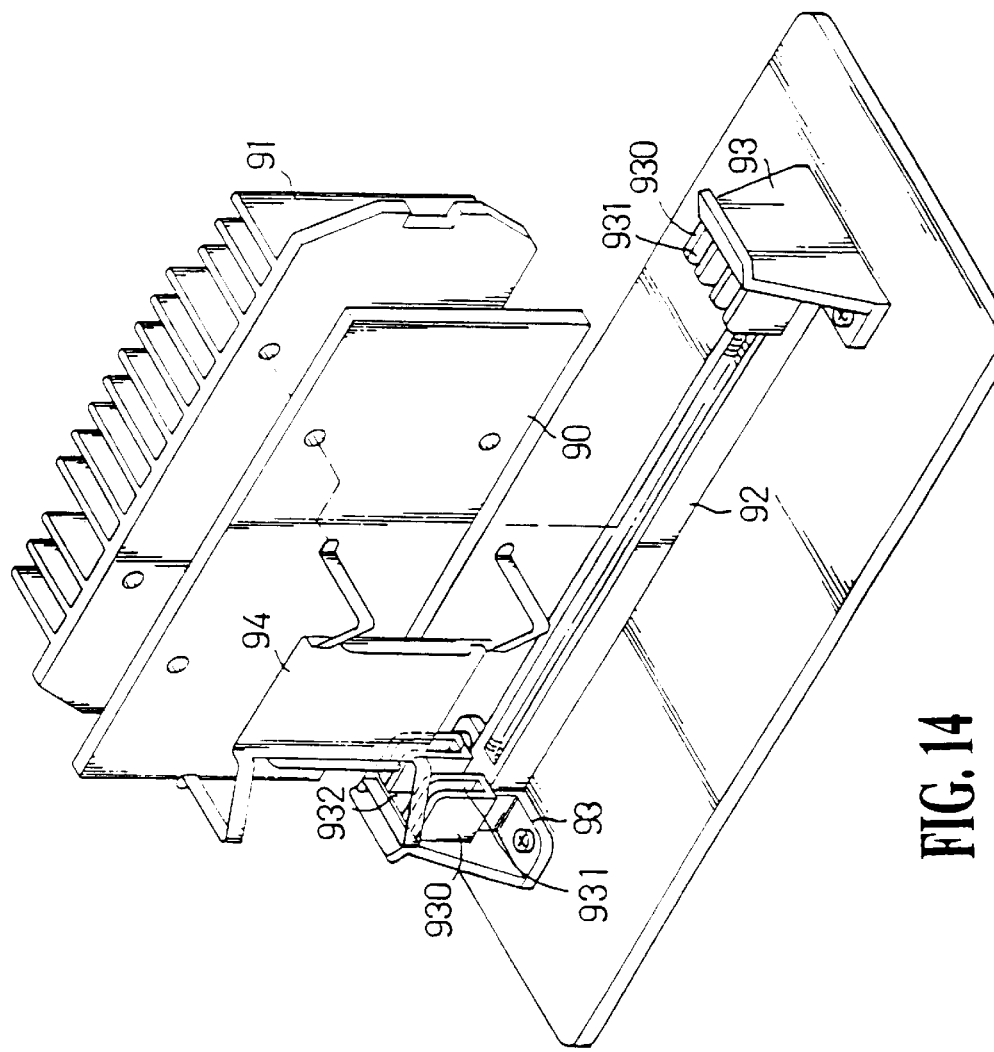
FIG. 14 is an exploded view indicating a conventional connector holding a card type CPU.

On the basis of the principle of the invention, the stationary piece 10 and the movable piece 20 of a connector half can be integrated into a single-piece part if necessary. Such a single-piece construction still can be used for holding a central processing unit of either cartridge type or card type. FIGS. 11 and 12 show the second embodiment of a central processing unit connector with such a construction. As shown in the drawings, the integrated connector half 100 does not contain a movable piece. The body of the connector half has two retaining slots 101 and two elongated notches 102 formed on the upright wall for holding a cartridge type central processing unit 80 (shown in FIG. 11). Arranged on the upright wall is an incompletely connected retaining protrusion 103 that obliquely inwardly extends with the locking means 104 formed on the lower end and a moving lever 105 upwardly extending over the locking means 104. These mechanisms provide the connector half with the capability of securing a card type central processing unit 90 as shown in FIG. 12. It is understood that the invention is not limited to the exemplary embodiment described above but that various modifications are possible within the scope of the invention.

What is claimed is:

1. A connector structure comprising two connector halves having the same configuration composed of a stationary piece and a movable piece for use on a mother board to hold a central processing unit either of cartridge type or of card type and characterized in that said stationary piece has a body with a generally L-shaped cross section and is provided with a receiving slot on its bottom at the central position thereof, two base portions separately on two sides of the receiving slot, two vertical flange walls respectively at the internal bottom surface near two ends of the receiving slot, a pivotal slot on one side surface of each flange wall, two holding arms parallel to said flange walls, and raised dots on the surface of holding arms facing toward the flange walls; and characterized in that said movable piece has a generally rectangular body provided with two retaining slots and two elongated notches on the upper end, and an incompletely connected retaining protrusion on one side;

said retaining protrusion inwardly obliquely extending and being configured to have locking means on a lower portion thereof and a moving lever extending from a lower end thereof upwardly over the locking means, said movable piece extending on one end thereof to form two parallel pivotal arms between said flange wall and said holding arms, said two pivotal arms each having a pivotal pin arranged on one side surface and suitable for being accommodated in said pivotal slot of the flange wall, and an engagement slot formed on the other side surface thereof and adapted for catching said raised dots of the holding arms.

2. The connector structure as claimed in claim 1, wherein a distance between said pivotal arms of the movable piece approximately equals to that between a opposite outer wall surfaces of two flange walls of the stationary piece, and said two pivotal pins are formed on opposed inner wall surfaces of the pivotal arms, and said pivotal slots are individually disposed on the opposite outer wall surfaces of the flange walls.

3. The connector structure as claimed in claim 1 wherein the distance between said two pivotal arms of the movable piece roughly equals to that between the inner wall surfaces of the flange walls of the stationary piece, and said pivotal pins are formed on the opposed outer wall surfaces of the pivotal arms, and said pivotal slots are formed on the opposed inner wall surfaces of the flange walls.

4. The connector structure as claimed in claims 1, 2, or 3 wherein the pivotal pin of the movable piece has a conical free end.

5. The connector structure as claimed in claim 4 wherein said stationary piece has a guiding slot formed on the side surface of the flange walls, which guiding slot has an inclined bottom surface and extends from the edge of the flange walls to said pivotal slot.

6. The connector structure as claimed in claim 1 wherein the stationary piece has a vertical stud on the bottom face of two base portions thereof, said vertical stud having a conical swelled free end that is split into two compressible resilient halves by an open slot arranged along the longitudinal axis of the stud.

7. The connector structure as claimed in claim 6 wherein said stationary piece is further provided on two base portions with a rectangular locking opening that is in communication with the open slot of said stud, and a nail disposed in the rectangular opening;

said rectangular opening having a larger upper portion and a smaller lower portion with stepped internal wall surface, said nail having a rectangular body corresponding to the shape of said opening, a swelled head portion larger than said nail body in outside diameter, a resilient through hole formed on the nail body, a raised dot arranged on two sides of the nail body to abut against the stepped flat wall, and a projection tongue upwardly extending from the lower edge of the resilient hole to a point where the free end of the projection tongue slightly protrudes out of the surface of the nail body in order to press against the inner wall surface of a stud half when said nail is inserted into said rectangular opening.

8. The connector structure as claimed in claims 6 or 7 wherein said stationary piece has a longitudinal slot formed on the opposed internal wall surface of the stud halves.

9. A connector structure comprising two connector halves for use on a mother board to hold a central processing unit either of cartridge type or of card type and characterized in that each connector half is an integrally molded one-piece part, said connector half having two retaining slots and two notches formed on the upright walls thereof, a receiving slot at a central area of a lower end, two base portions individually disposed on two sides of said receiving slot, an incompletely connected retaining protrusion arranged on the upright wall, and a moving lever upwardly extending over said retaining protrusion from the lower end thereof, said retaining protrusion obliquely inwardly extending with locking means arranged on the lower end thereof.

10. The connector structure as claimed in claim 9 wherein a stationary piece has a vertical stud disposed on two base portions, said stud being configured to have a swelled conical free end that comprises an open slot formed in the central axial direction to divide said stud into two resilient compressible stud halves.

11. The connector structure as claimed in claim 10 wherein said stationary piece has a rectangular locking opening formed on said stud and being in communication with the open slot of said stud, and characterized in that the locking opening has a larger upper portion and a smaller lower portion with a stepped inner wall surface, and in that a nail seated in the locking opening has a rectangular body corresponding to the shape of said locking opening, a larger head portion disposed on a top thereof, a resilient through hole arranged on the nail body, a raised dot formed on two sides of the nail to press against the stepped internal wall surface, and a projection tongue extending from the lower edge of the resilient through hole to a point where the free end of the projection tongue slightly protrudes out of the nail body and presses against the inner wall surface of stud halves.

* * * * *